United States Patent [19]

Vandling

[11] 4,227,218
[45] Oct. 7, 1980

[54] METHOD AND APPARATUS FOR GENERATING A DIGITAL FACSIMILE SIGNAL

[75] Inventor: John M. Vandling, Pleasantville, N.Y.

[73] Assignee: Exxon Research & Engineering Co., Florham Park, N.J.

[21] Appl. No.: 969,581

[22] Filed: Dec. 14, 1978

[51] Int. Cl.² .............................................. H04N 1/40
[52] U.S. Cl. .................................... 358/282; 358/280
[58] Field of Search ................ 358/280, 282, 283, 284

[56] References Cited

U.S. PATENT DOCUMENTS

| | | | |
|---|---|---|---|
| 3,223,778 | 12/1965 | Stone | 358/284 |
| 3,294,896 | 12/1966 | Young | 358/283 |
| 3,566,281 | 2/1971 | Baumann | 328/171 |
| 3,675,201 | 7/1972 | McKissick | 358/282 |
| 3,723,649 | 3/1973 | Pitegoff | 358/282 |
| 3,868,477 | 2/1975 | Katzman | 358/284 |

Primary Examiner—Howard W. Britton
Attorney, Agent, or Firm—N. L. Norris

[57] ABSTRACT

A facsimile transmitter detects dark-light variations in an illuminated document by means of a photodetector. After amplification, the output from the photodetector is applied to a threshold detector generating a multi-level digital signal. When the magnitude of the amplified photodetector signal is greater than one fixed threshold level, one level of the digital signal is generated. When the magnitude of the amplified photodetector signal is less than another fixed threshold level, another level of the digital signal is generated. When the magnitude of the amplified photodetector output lies between the two threshold levels, one level of the digital signal is generated when the peaked, amplified photodetector signal is greater than the unpeaked amplified photodetector signal and the other level of the digital signal is generated when the peaked amplified photodetector signal is less than the unpeaked, amplified photodetector signal. The threshold detector output is utilized to control a carrier modulator which generates signals for transmission to a remotely located receiver through a communications link.

12 Claims, 4 Drawing Figures

METHOD AND APPARATUS FOR GENERATING A DIGITAL FACSIMILE SIGNAL

BACKGROUND OF THE INVENTION

This invention relates to facsimile transmitters of the type utilized in facsimile systems including a transmitter, a receiver and a communications network therebetween. More particularly, this invention relates to facsimile transmitters wherein a document is scanned so as to generate electrical information-bearing signals representing the dark-light variations in the document. These information-bearing signals may then be transmitted over the communications network or link to a facsimile receiver where the information-bearing signals are converted to marks or images on a copy medium so as to form a copy which is a resonable facsimile of the original document.

In some instances, it is desirable to generate a digital signal representing the dark-light variations of the document. Such a digital signal, typically a binary signal, has a first level representing white or light areas of the document and a second level representing dark or black areas of the document. Such a binary signal is then utilized to control suitable modulation means such as a frequency shift keyed (FSK) signal generator which generates signals of two different frequencies representing the black-white variations in the document. Of course, a typical document, even one limited to alpha numeric matter, will be characterized by black areas, white areas and areas of intermediate darkness or gray areas. Where it is desirable to generate the abovedescribed binary signal, it becomes necessary to establish certain threshold levels in which areas lighter than a predetermined threshold of darkness will produce one level of the binary signal and areas darker than that threshold darkness will produce the other level of the binary signal.

Typically, the threshold level is fixed so that when the magnitude of an analog signal representing the dark-light variations exceeds the fixed threshold level, one level of the binary signal will be produced and when the magnitude of that signal is less than the fixed threshold, the other level of the binary signal will be produced.

Determining the level of the binary signal by comparison of the dark-light analog signal with a fixed threshold can create certain distortions in the information carried by a transmitted facsimile signal. For example, it is possible that a noticeable contrast in the document will be insufficient to permit the analog signal to cross a predetermined fixed threshold level. As a consequence, dark-light variations which should produce a black-white variation at a receiver produce only a single level of the binary signal. Moreover, it becomes virtually impossible to select a single threshold level for all documents. In one document where a great deal of contrast exists, a particular threshold level is appropriate. However, on a document which has less contrast (for example, the entire document may be quite dark including the background on which the information is written) a completely different threshold level is required. Furthermore, the use of such an all-important, single threshold level creates unreliability when that threshold level drifts for electrical or mechanical reasons with age and/or temperature.

These difficulties can be compounded where video peaking techniques are utilized to electrically enhance the fine detail of a document since video peaking can enhance noise as information. The term noise may include electrical noise as well as nonelectrical induced noise resulting from the typical uneveness of the copy paper structure and mechanical vibrations generated during scanning.

SUMMARY OF THE INVENTION

It is an object of this invention to provide a method and apparatus for generating multi-level digital signals which accurately represent dark-light variations in a document.

It is a further object of this invention to generate such digital signals without relying upon a single fixed threshold level.

It is another object of this invention to enhance fine detail in a document where the fine detail would not normally be resolved due to optical limitations of the system while at the same time controlling the detection of noninformation bearing signals resulting from noise.

In accordance with these and other objects of the invention, a facsimile transmitter comprises sensor means for sensing dark-light variations in a document and generating an analog signal representing the dark-light variations. Conversions means coupled to the sensor means establish a two-level digital signal representing the dark-light variations. Transmission means coupled to the conversion means generates transmission signals from the digital signal. The conversion means includes fixed threshold means for producing one level of the digital signal when the magnitude of the analog signal lies on one side of the fixed threshold and variable threshold means for producing two levels of the digital signal when the magnitude of the analog signal moves to opposite sides of the variable threshold level on the other side of the fixed threshold level.

In accordance with another important aspect of the invention, additional fixed threshold means produce another fixed threshold level. When the magnitude of the analog signal lies on the other side of the other fixed threshold level, the other of the two levels is generated. The variable threshold lies between the one fixed threshold level and the other fixed threshold level.

In accordance with a further important aspect of the invention, both fixed threshold means comprises comparison means for comparing the analog signal to two different fixed reference levels.

In accordance with still another important aspect of the invention, the variable threshold means comprises means for comparing peaked and unpeaked analog signals and generating the different levels of the digital signal in response to the comparison.

DETAILED DESCRIPTION OF A PREFERRED EMBODIMENT

Figure 1:
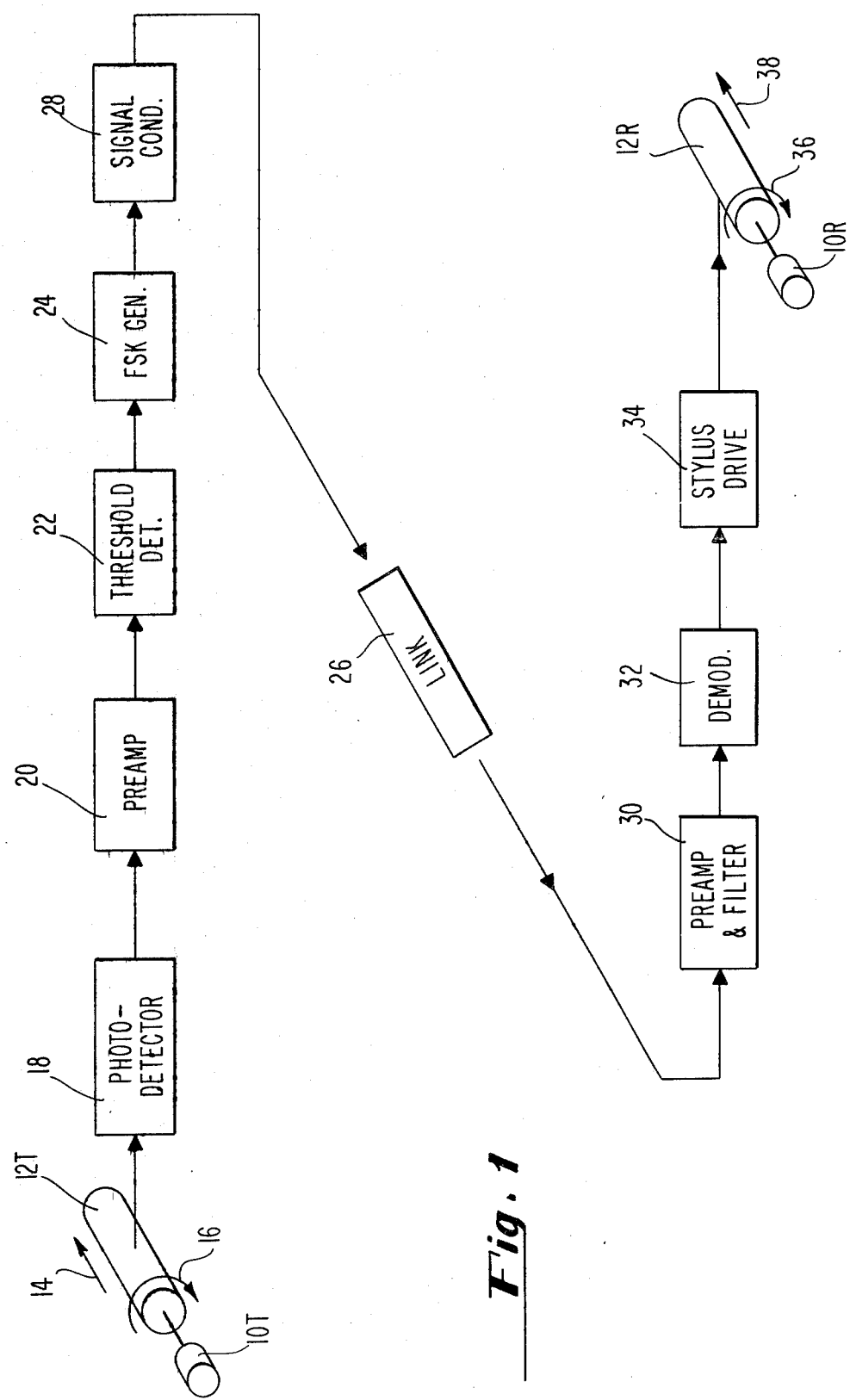
FIG. 1 is a block diagram of a facsimile system embodying the invention.

Referring now to the facsimile system shown in FIG. 1, a facsimile transmitter comprises a drum 12T rotated by a motor 10T so as to create a relative scanning movement in a document carried by the drum 12T and a scanning head not shown. As the scanning head is advanced axially along the drum 12T in a direction indicated by an arrow 14 and the drum rotates about its axis in a direction indicated by an arrow 16, successive paths on the document are illuminated and variations in light intensity due to the reflectivity of the document are scanned by a photodetector 18. The output from the photodetector 18 is applied to a preamplifier 20.

In accordance with this invention, the analog signal representing the dark-light variations in the document at the output of the preamplifier is applied to a threshold detector 22 which converts the analog signal into a two-level digital or binary signal representing dark and light areas on the document. As will be explained in detail subsequently, the threshold detector 22 produces one digital level when the magnitude of the analog signal is above or exceeds a predetermined upper threshold, the second level when the magnitude of the analog signal is below or less than a second predetermined threshold and both first and second levels in response to the crossing of a variable threshold between the first fixed threshold level and the second fixed threshold level.

The output of the threshold detector 22 is coupled to a suitable carrier modulator such as an FSK (frequency shift keyed) generator 24 which produces a first transmission frequency in response to one level of the binary signal from the threshold detector 22 and a second transmission frequency in response to the second level of the binary signal. Prior to transmission over a communication link or channel 26, the FSK transmission signal is passed through a signal conditioning network 28.

At a receiver which is connected to the link 26, the FSK transmission signal (sometimes referred to as "space" and "mark" signals) is amplified and filtered at a preamplifier and filter circuit 30. The output of the circuit 30 is coupled to a demodulator 32 which produces a binary signal corresponding to the digital signal generated at the transmitter. A stylus drive 34 is responsive to the digital signal to drive the stylus so as to reproduce the dark-light variations in the document at the transmitter in two tones, i.e, black and white. The stylus coupled to the driver 34 is associated with a movable head juxtaposed to a copy medium carried by a drum 12R. The relative scanning motion between the medium and the head is achieved by rotating the drum 12R in a direction indicated by an arrow 36 by means of a motor 10R as the head moves in a direction indicated by the arrow 38.

Figure 2:
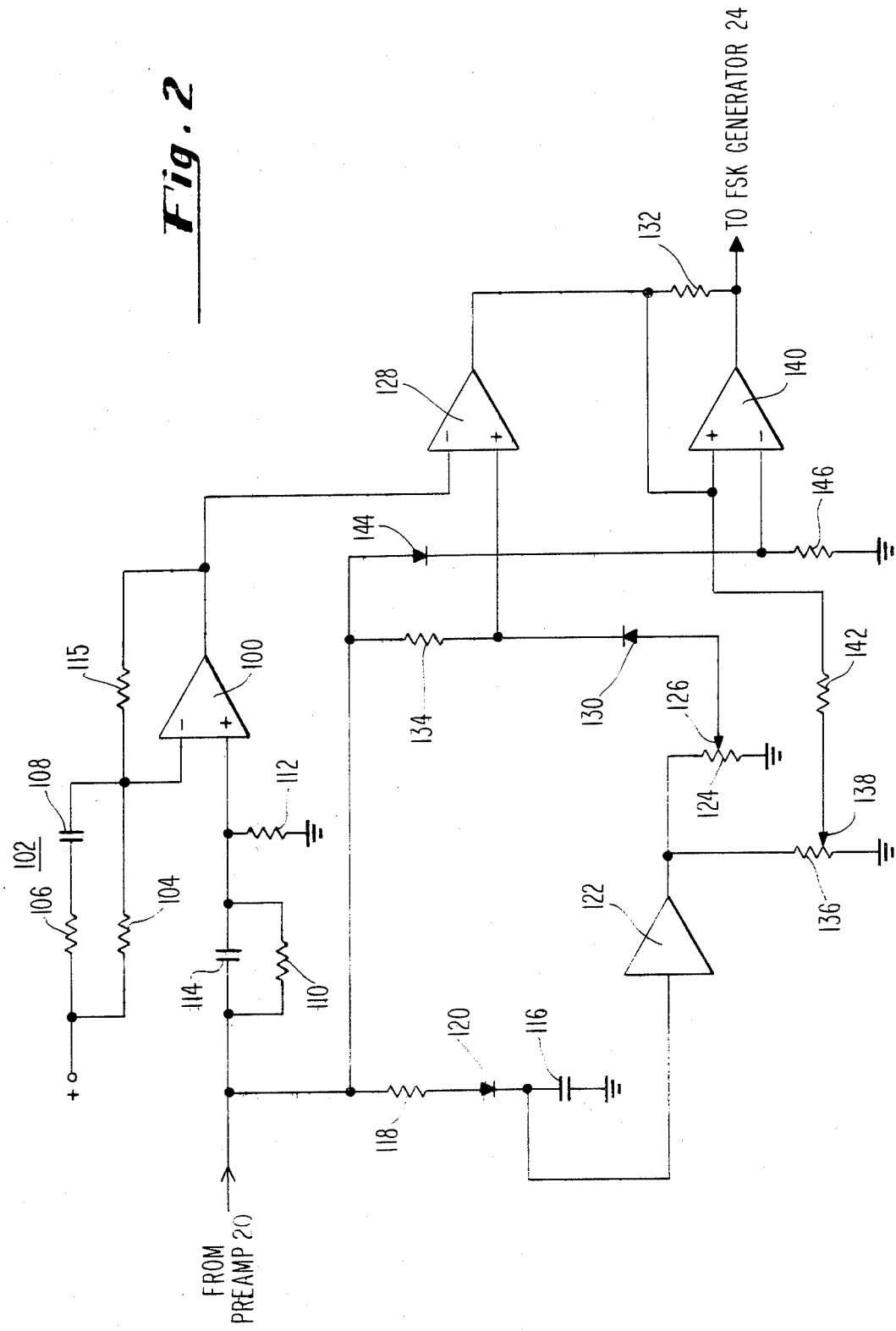
FIG. 2 is a schematic diagram of the threshold detector shown in FIG. 1.

The threshold detector 22 of the preferred embodiment of the invention will now be described in detail with reference to FIG. 2. As shown in FIG. 2, the output from the preamplifier 20 is applied to a peaking circuit comprising an operational amplifier 100 having a high frequency peaking network 102 including resistors 104 and 106 and a capacitor 108 connected to the inverting terminal. The high frequency peaking network 102 also comprises resistors 110 and 112 and a capacitor 114 which are connected to the noninverting terminal of the operational amplifier 100 to which the output from the preamplifier 20 is coupled. The DC gain of the operational amplifier 100 is determined by a feedback resistor 115.

The output from the preamplifier 20 is also connected to a white peak detecting circuit including a capacitor 116 which stores the peak voltage level from the output of the preamplifier 20. The white peak detecting circuit includes a resistor 118 and a diode 120 where the resistor 118 average the charge stored in the capacitor 116 which represents an average white level. An operational amplifier 122 is connected to the junction between the capacitor 116 and 120 so as to permit sampling of the voltage across the capacitor 116 without rapid discharge of that voltage. The output of the amplifier 122 is then utilized as a reference voltage which represents the overall whiteness or background level of the document as will now be described.

In accordance with one important aspect of the invention, two threshold levels are established from the output of the operational amplifier 122. One of these threshold levels which may be described as the black threshold level is established by a potentiometer 124 having a tap 126 connected to the noninverting terminal of a comparator 128 through a diode 130. The inverting terminal of the comparator 128 is connected directly to the output of the operational amplifier 100. When the peaked output signal from the operational amplifier 100 is less than the predetermined black threshold level and the unpeaked output from the preamplifier 20 is of a lesser magnitude than the threshold level established at the tap 126, the diode 130 will be forward biased so as to produce a voltage at the noninverting terminal which is more positive than the voltage at the inverting terminal and thereby produce a high going output from the comparator 128 which is applied to the FSK generator 24 through a resistor 132. On the other hand, if the unpeaked signal from the preamplifier 20 is sufficiently positive to back bias the diode 130, the comparator 128 will compare the peaked signal from the operational amplifier 100 with the unpeaked signal as applied through a current limiting resistor 134. Under these circumstances, the output from the comparator 128 will go high or low depending upon whether the peaked signal as applied to the inverting terminal is less than or greater than the unpeaked signal applied to the noninverting terminal of the comparator 128. However, when the unpeaked video reaches a predetermined white level, the output to the FSK generator 24 goes low regardless of the output from the comparator 128 by means of the white level threshold circuitry which will now be described.

The white level threshold circuitry comprises a potentiometer 136 having a tap 138 connected to the noninverting terminal of a comparator 140 through a resistor 142. When the unpeaked signal from the preamplifier 20 applied to the inverting terminal of the comparator 140 is greater than the threshold level at the noninverting terminal of the comparator as established by the potentiometer 136, the output of the comparator 140 is forced low. The unpeaked signal is applied to the inverting terminal of the comparator 140 through a diode 144 which compensates for the drop across the diode 120. A resistor 146 provides a return path to ground.

Figure 3:
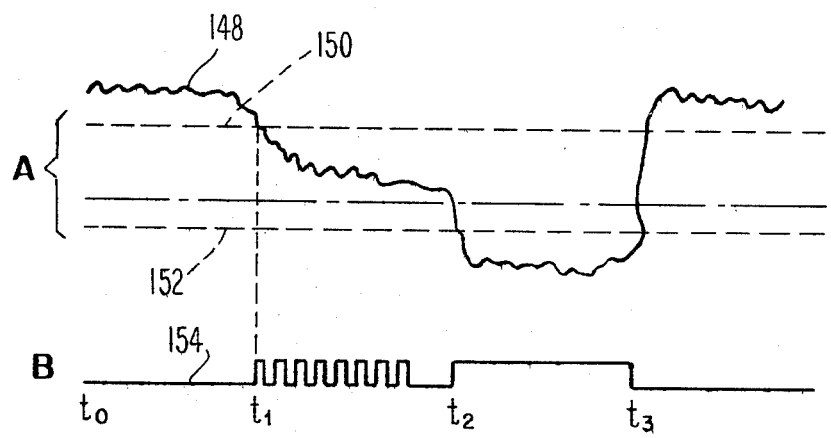
FIG. 3 is a waveform diagram utilized in explaining the operation of the threshold detector shown in FIG. 2.

Reference will now be made to FIG. 3 for a supplemental explanation of the operation of the circuit shown in FIG. 2 which results in the establishment of relatively fixed black and white threshold levels and an intermediate floating or variable threshold for producing a two-level digital or binary signal. As shown in waveform A, a line 148 represents the peaked video signal from the output of the operational amplifier 100. A dotted line 150 represents the relatively fixed white threshold level as established by the capacitor 116 and the operational amplifier 122 in combination with the potentiometer 136. The dotted line 152 represents the relatively fixed black threshold level as established by the capacitor 116 and the operational amplifier 122 in combination with the potentiometer 124. Referring to waveform B of FIG. 3, a two-level digital or binary signal is shown representing white/black and black/white transitions. The binary signal 154 between times $t_0$ and $t_1$ is in a low state or level so as to represent a white area which corresponds with the period of time in which the signal 148 of waveform A exceeded the threshold level 150. At times $t_1$ to $t_2$, the binary signal varies between a high and low state or level as the threshold level corresponding to the unpeaked video is less than or greater than the peaked video signal. From times $t_2$ to $t_3$, the binary signal 154 goes to a high level or state corresponding to black when the peaked video signal 148 is less than the threshold level 152 shown in waveform A. After time $t_3$, the binary signal 154 again goes low corresponding to the white area when the peaked video signal 148 exceeds the threshold level 150.

Figure 4:
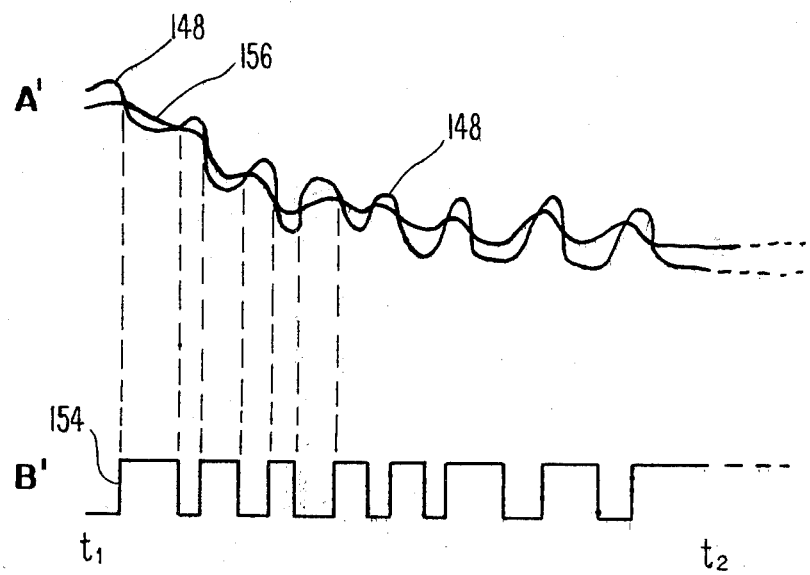
FIG. 4 is an enlarged portion of one segment of the waveform shown in FIG. 3.

In order to provide a further explanation for the generation of the binary signal 154 between times $t_1$ and $t_2$, reference will be made to the enlarged waveforms A and B of FIG. 4 between times $t_1$ and $t_2$. As shown in waveform A, the peaked video signal 148 goes above and below the unpeaked video signal 156. When the peaked video signal 148 exceeds the unpeaked video signal 156, the binary signal 154 is low corresponding to white. When the unpeaked video signal 156 exceeds the peaked video signal 148, the binary signal 154 goes high corresponding to black.

In the foregoing, we have referred to relatively fixed black and white thresholds. In fact, these thresholds, which are determined by the charge on the capacitor 116, are not absolutely fixed but only relatively fixed as contrasted with the variable threshold provided by the unpeaked video signal.

As utilized herein, the term digital is intended to enbrace a signal having two or more discrete levels. Preferably the levels are characterized by nonambiguous boundary levels, i.e., there exists a snap action in the transition from one level to another.

Although a particular embodiment of the invention has been shown and described, it will be understood that other embodiments and modifications will occur to those of ordinary skill in the art which fall within the true spirit and scope of the invention as set forth in the appended claims.

What is claimed is:

1. A facsimile transmitter comprising:
sensor means for sensing dark-light variations in a document and generating a video analog signal representing said dark-light variations;
conversion means coupled to said sensor means for establishing a multi-level digital signal representing said dark-light variations; and
transmission means coupled to said conversion means for generating transmission signals representing said digital signals;
said conversion means comprising
fixed threshold means for producing one of the multi-levels of said digital signal when the magnitude of said analog signal lies on one side of a relatively fixed threshold level; and
variable threshold means for producing said multiple levels of said digital signal when the magnitude of the analog signal moves to opposite sides of a variable threshold level on the other side of said relatively fixed threshold level.

2. The facsimile transmitter of claim 1 further comprising:
additional fixed threshold means for producing the other of said multiple levels of said digital signal when the magnitude of said analog signal lies on the other side of an additional relatively fixed threshold level, said variable threshold lying between said relatively fixed threshold level and said additional relatively fixed threshold level.

3. The facsimile transmitter of claim 2 wherein
said fixed threshold means comprises comparison means for comparing said analog signal to a relatively fixed reference signal; and
said additional threshold means comprises additional comparison means for comparing said analog signal to an additional relatively fixed reference signal.

4. The facsimile transmitter of claim 3 wherein said variable threshold means comprises means for comparing peaked and unpeaked analog signals.

5. The facsimile transmitter of claim 4
wherein said analog signal is peaked for comparing at said comparison means with said relatively fixed reference signal; and
wherein said analog signal is unpeaked for comparing at said additional comparison means with said additional fixed reference signal.

6. The facsimile transmitter of claim 1 wherein said relatively fixed threshold level varies with the overall background of the document.

7. A method of producing a digital signal for use in a facsimile transmission comprising:
generating a video analog signal representing dark-light variations in various gradations;
converting said analog signal to a digital signal having
a first level when the magnitude of said analog signal lies on one side of a threshold; and
said first level and a second level when the magnitude lies on the other side of said threshold and moves across a variable threshold.

8. The method of claim 7 wherein said digital signal has said second level when the magnitude lies on the other side of a second threshold;
said variable threshold lying between said first threshold and said second threshold.

9. A method of producing a digital signal for use in a facsimile transmission comprising the following steps:
sensing said dark-light variations in a document;
generating a video analog signal representing sensed dark-light variations in the document;
peaking the analog signal; generating one level of the digital signal when the peaked analog signal exceeds the analog signal in magnitude; and
generating another level of said digital signal when the analog signal exceeds the peaked analog signal in magnitude.

10. The method of claim 9 including the step of generating said one level of said digital signal when the analog signal lies on one side of a predetermined threshold.

11. The method of claim 10 including the step of generating said other level of said digital signal when the analog signal lies on the other side of another predetermined threshold level.

12. The method of claim 9 including the following steps:

always generating said one level of said digital signal when the peaked analog signal is less than one predetermined threshold level; and always generating said other level when the unpeaked analog signal is greater than another predetermined threshold level.

* * * * *